United States Patent [19]

Auston et al.

[11] 4,155,779
[45] May 22, 1979

[54] CONTROL TECHNIQUES FOR ANNEALING SEMICONDUCTORS

[75] Inventors: David H. Auston, Mountainside; Jene A. Golovchenko, Basking Ridge; Richart E. Slusher, Lebanon; Clifford M. Surko, Martinsville; Thirumalai N. C. Venkatesan, Highland Park, all of N.J.

[73] Assignee: Bell Telephone Laboratories, Incorporated, Murray Hill, N.J.

[21] Appl. No.: 935,665

[22] Filed: Aug. 21, 1978

[51] Int. Cl.² ........................................... H01L 21/26
[52] U.S. Cl. ..................................... 148/1.5; 148/171; 148/186
[58] Field of Search ................. 148/1.5, 171, 172, 186

[56] References Cited

U.S. PATENT DOCUMENTS

| | | | |
|---|---|---|---|
| 3,364,087 | 1/1968 | Solomon et al. | 156/4 |
| 3,585,088 | 6/1971 | Schwuttke et al. | 148/1.5 X |
| 3,716,844 | 2/1973 | Brodsky | 340/173 LS |
| 4,021,675 | 5/1977 | Shifrin | 148/1.5 X |
| 4,063,967 | 12/1977 | Graul et al. | 148/1.5 |
| 4,082,958 | 4/1978 | Kirkpatrick | 252/492 B |

OTHER PUBLICATIONS

IBM Technical Disclosure Bulletin, vol. 13, No. 2, Jul. 1970, pp. 316 and 317.

*Primary Examiner*—G. Ozaki
*Attorney, Agent, or Firm*—Peter V. D. Wilde

[57] ABSTRACT

Polycrystalline and amorphous semiconductors can be annealed using a laser or electron beam to restore or obtain crystal order by epitaxial regrowth on a crystal substrate. When the annealing occurs by liquid phase epitaxy, the presence and lifetime of a molten state at the region being annealed can be used to control the annealing process. Various control mechanisms are described.

16 Claims, 6 Drawing Figures

CONTROL TECHNIQUES FOR ANNEALING SEMICONDUCTORS

BACKGROUND OF THE INVENTION

The diffusion of impurities in single crystal semiconductors has been studied thoroughly. The diffusion behavior is well understood and important commercial processes, notably in silicon, are based on this understanding.

Recently, considerable experimentation by many investigators has established that short pulses of laser or electron beam radiation can be used to heal radiation damage to semiconductor crystals that occurs during implantation of impurities. See, e.g., G. A. Kachurin and E. V. Nidaev, *Sov. Phys, Semiconductors* 11, 350 (1977); G. Foli, E. Rimini, M Bertolotti and G. Vitali, *Proc. Thin Film Symposium*, Atlanta, Georgia, October 1977. (Published by the Electrochemical Society of America, J. E. Baglin and J. M. Poate, ed.); W. L. Brown et al, *Proc. Conf. on Rapid Solidification Processing*, Reston, VA, November 1977 (Published by the Defense Research Projects Agency and the National Bureau of Standards). In many of those experiments it was found that the boundary of the impurity region moves substantially during the annealing process. The reason for this was not known, since the movement could not be accounted for by solid state diffusion in the short treatment periods involved. Speculation followed, which we have now confirmed, that suitable pulses actually melt the regions of the semiconductor on which they are incident and those regions regrow epitaxially. The diffusion of impurities in the molten phase is substantially faster than the solid state rate--fast enough to explain the movement of the boundary.

It is evident then at this point that laser or electron beam annealing is a new processing tool, not only for annealing ion damage effectively in very short time periods, but for relocating impurities in semiconductors on a selective basis. We have devised, in addition, a technique for precisely controlling the annealing process.

BRIEF STATEMENT OF THE INVENTION

According to the invention, the light reflectivity of the surface of the material that is to be annealed is monitored during the annealing process. After the annealing beam is turned on, the surface melts, and the reflectivity of the surface changes. It changes again when the surface solidifies after the beam is turned off. The time difference between these changes is the lifetime of the molten surface, and the liquid state diffusion period for the impurities to redistribute. Precise determination of the extent of annealing as well as the final depth of the impurity layer is obtained in response to the duration of the molten zone lifetime. Control can be effected using this information.

DETAILED DESCRIPTION

Figure 1:
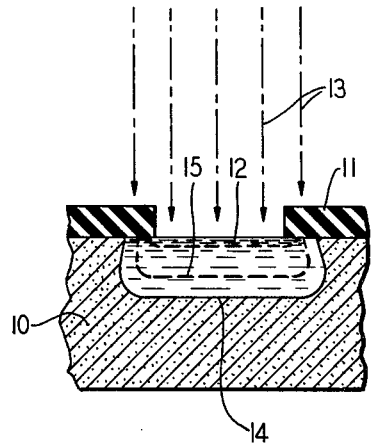
FIG. 1 is a schematic illustration of the impurity redistribution effect occuring during laser annealing.

A qualitative description of the process is aided by FIG. 1 which shows a substrate material 10, which in a preferred embodiment is a semiconductor such as silicon or gallium arsenide, or other substrate susceptible to advantageous ion implantation processes. The substrate is covered, but for the window shown, by a masking layer 11 e.g., $SiO_2$. The laser energy, indicated by the schematic beam 13, is incident on the window. Numeral 12 indicates the initial position of the impurity boundary after implantation (and in this case before anneal). Upon exposure to the laser beam, the portion illustrated, the boundary of which is denoted by line 14, becomes molten. The impurities diffuse in the liquid phase, forming an ultimate region with a boundary designated 15. In a preferred case the boundaries 12 and 14 are p-n junctions. In accordance with one aspect of the invention the annealing process can be adapted and controlled either to minimize redistribution or to achieve a controlled movement of implanted impurities. It can be used also to monitor epitaxial regrowth during laser annealing of unimplanted noncrystal material (either amorphous or polycrystalline).

Figure 2:
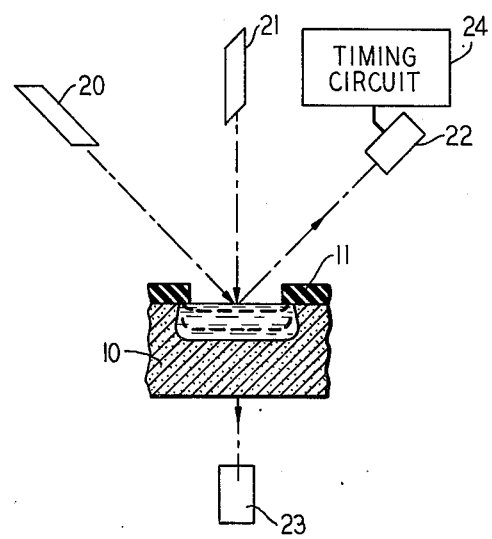
FIG. 2 is a schematic representation of an apparatus useful for effecting the result described by FIG. 1.

With reference to the apparatus of FIG. 2 the existence and duration of the molten region is detected by directing a beam from laser 20 or other appropriate energy beam, onto the surface exposed to the beam from the annealing laser 21. A detector 22 for measuring the intensity of the light reflected from that surface is placed so as to receive the reflected beam. A detector 23, situated to receive light penetrating the wafer was also used to obtain the data presented below, but is not necessary for the practice of the invention. A timing circuit is connected as a feedback loop between the detector 22 and the laser 21 as shown. Its use comprises a preferred embodiment in which the extent of laser annealing or the control of the depth of the impurity region is in automatic response to the measured lifetime of the molten region.

The procedure just outlined was demonstrated by the following:

The samples used were 0.25 mm thick (111) silicon wafers cut from a 1000 ω-cm p-type dislocation-free floating-zone ingot. They were polished with syton on both faces to permit the observation of the transmitted annealing laser beam. Arsenic was implanted on one face at 50 keV in various doses ranging from $10^{14}$ to $10^{17}$ ions/$cm^2$. Rutherford backscattering spectra showed an impurity profile which peaked at 320 Angstroms from the surface with a 1/e halfwidth of 170 Angstroms.

A Q-switched Nd:glass oscillator and amplifier system was used to generate the annealing pulses at a wavelength of 1.06 μm. Mode-control was used in the oscillator to produce a single transverse mode having a Gaussian profile and a diameter (FWHM) of 1.2 mm at the oscillator output and 3.3 mm at the samples. The duration of the pulses was 50 nsec (FWHM). By varying the gain of the optical amplifier it was possible to continuously adjust the incident annealing pulse energy from 0.65 J/cm² to 16 J/cm² and the corresponding peak intensity from 12 MW/cm² to 300 MW/cm². Both the incident and transmitted 1.06 μm pulses were recorded with high-speed photodiodes and oscilloscopes with response times of 1 nsec. A small (1 mm) aperture was placed behind the sample to ensure that only the central portion of the transmitted beam was measured.

A continuous 0.63 μm HeNe laser was used to measure the optical reflectivity of the implanted surface during the annealing. This beam was focused to a diameter of approximately 0.3 mm and was aligned with the center of the annealing beam at the crystal surface. The angle of incidence of the 0.63 μm beam was 57.5 degrees to the surface normal. A polarizer and quarter wave plate were employed to measure the reflectivity for both perpendicular and parallel polarizations, $R_\perp$ and $R_{||}$, respectively. An avalanche silicon photodiode was used to detect the reflected beam with a rise time of approximately 5 nsec. Accurate timing was insured by synchronously triggering the recording of the incident and transmitted 1.06 μm pulses and the 0.63 μm reflectivity signal.

The extent of the annealing in the samples was determined by Rutherford backscattering and channeling analysis using 1.9 meV alpha particles. For an incident laser energy greater than 1.8 ± 0.3 J/cm² in the $10^{16}$/cm² sample the channelled spectrum of the annealed sample had a minimum yield of approximately 3 percent for both the Si and As spectra. This value is comparable to that of unimplanted single-crystal Si. Furthermore it indicates that the complex and extended damage associated with ion implantation has been annealed and that the As has been completely incorporated into substitutional lattice sites. After annealing with the highest energy pulses the concentration of As atoms fell to 1/e of its maximum value at a depth of 2000 Angstroms.

Figure 3:
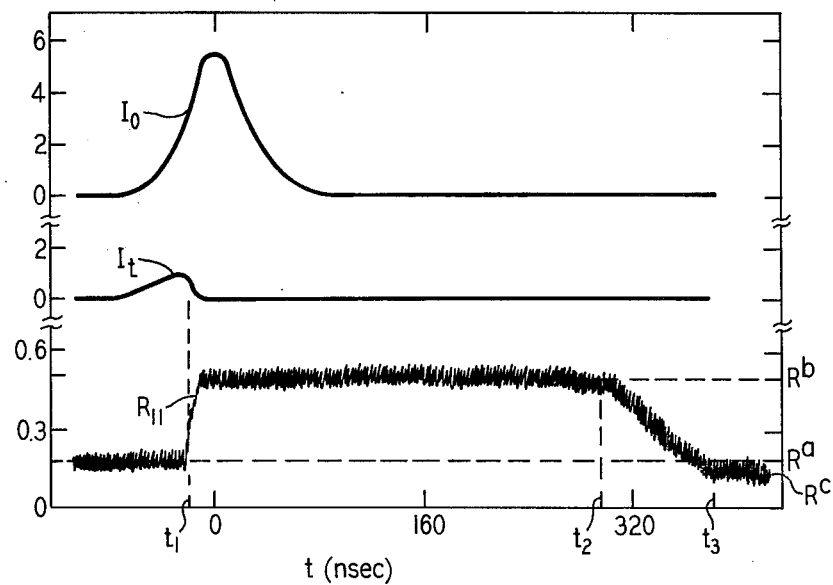
FIG. 3 is a plot showing, as a function of time, $I_o$, the intensity of the laser annealing pulse, $I_t$, the transmitted laser intensity (in arbitrary units), and R, the absolute value of the reflectivity of the surface on which the pulse is incident.
Figure 4:
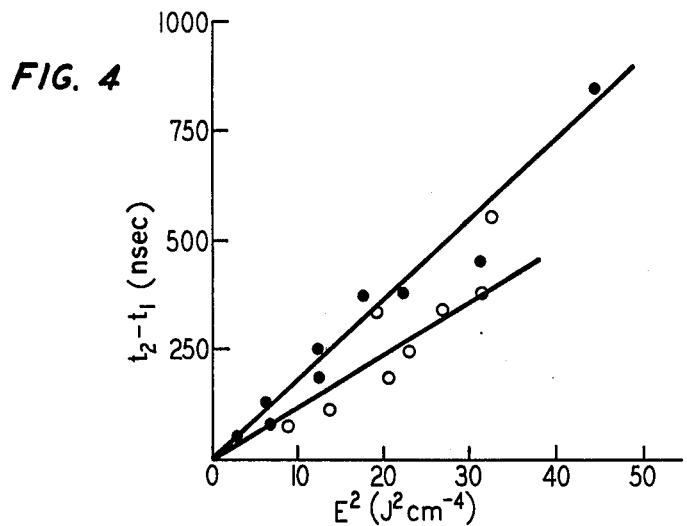
FIG. 4 is a plot of the lifetime of the molten zone as a function of the square of the incident laser energy per unit area E.

The time-resolved reflectivity measurements are illustrated in FIG. 3. These waveforms have a number of distinguishing features which constitute characteristic "signature" for laser annealing. At a time $t_1$ a sharp transition occurred when the transmitted 1.06 μm intensity decreased abruptly, and simultaneously the reflectivity of the 0.63 μm beam increased from an initial value $R^a$ to a new value $R^b$. This enhanced reflectivity remained constant until a time $t_2$ when it decreased to a new steady-state value $R^c$ at time $t_3$. For the $10^{16}$/cm² sample $R_{||}^a$, $R_{||}^b$, $R_{||}^c$ were measured to be 0.17, 0.47 and 0.13, respectively, and $R_\perp^a$, $R_\perp^b$, $R_\perp^c$ were 0.63, 0.82 and 0.57. These values agree to within ±10 percent with the calculated reflectivities of amorphous, metallic liquid, and crystalline silicon, respectively. The measured values did not change with increasing pulse energy and varied only slightly for different implant doses. Below energies of 1.6 J/cm² for the $10^{16}$/cm² (2.2 J/cm² for $10^{15}$/cm²) no appreciable change in reflectivity was observed. As the pulse energy was increased above these values, the duration of the flat portion increased reaching a maximum of as much as 800 nsec just before the threshold for catastrophic surface damage at approximately 7 J/cm² for both $10^{15}$ and $10^{16}$/cm² samples. This is illustrated in FIG. 4 where the duration of the flat portion of the reflectivity waveform, $t_2-t_1$, is plotted as a function of the square of the incident pulse energy per unit area, E.

The onset of the reflectivity change at time $t_1$ was observed to move back towards the leading edge of the incident pulse as the pulse energy increased. The integrated energy of the incident laser pulse from the beginning of the pulse to the time $t_1$ was found to be nearly constant for a given sample over the measured range of total pulse energies and found to be 0.9±0.1 J/cm² and 1.3±0.05 J/cm² for $10^{16}$ and $10^{15}$ ions/cm² samples, respectively. The corresponding intensities at $t_1$ were 34 MW/cm² and 49 MW/cm² which were also very nearly constant over the measured range of incident pulses.

As previously stated, the reflectivities $R_{||}^b$ and $R_\perp^b$ are consistent with the measured values of the complex index of refraction of liquid silicon (i.e., n=2.9 and k=5.1 at λ=0.63 μm). If the liquid Si were less than 200 Angstroms thick, the observed values of reflectivity at 0.63 μm would differ measurably from those predicted for an infinitely thick liquid. At 1.06 μm the extinction length (λ/4πk) in liquid Si is 120 Angstroms which accounts for the abrupt decrease in transmission of the annealing beam at time $t_1$ when the surface melts. The constant value of the reflectivity between $t_1$ and $t_2$ is strong evidence that the surface remains a liquid during this time interval. After $t_1$, the absorption of the annealing beam is determined entirely by the optical properties of the liquid, and the beam energy is deposited at a thin layer at the surface.

During the 50 nsec 1.06 μm pulse, heat can only diffuse into the solid a distance of approximately 2 μm and the heat capacity of this volume of hot solid is not sufficient to store all the deposited energy. Most of the incident beam energy deposited at the surface after the time $t_1$ is stored as latent heat of fusion. For a deposited energy of 1.2 J/cm² (corresponding to the longest observed flat-top reflectivity waveform) the liquid layer is approximately 1 μm thick. This distance is longer than the penetration of the As atoms. If we assume the As moves in the liquid by diffusion, then the penetration depth will be approximately $\sqrt{2D_L\tau}$, where $\tau$ is the difference between $t_2$ and $t_1$ and the diffusion coefficient of As in liquid silicon is estimated to be $1\times10^{-4}$ cm²s⁻¹. The As will then diffuse approximately 1300 Angstroms. Since the initial distribution was peaked at 320 Angstroms, the final distribution would be expected to be 1/e of its maximum experimental value of 2000 Angstroms.

The duration of the "flat-top" portion of the reflectivity signature corresponds to the time required for the complete solidification of the liquid layer at the crystal surface. As illustrated in FIG. 4, this time varied as the square of the incident energy. The time $\tau$ is the time required for the absorbed energy per unit area, $E_a$, to diffuse into the solid so that it is stored in the heat capacity of hot solid (i.e., at $T<T_M$). We estimate $$\tau \simeq \frac{E_a^2}{(T_M - T_o)^2 C^2 D}, \quad (1)$$

where $T_M$ is the melting temperature (1685 degrees K.), $T_o$ is 300 degrees K., C is the specific heat (2.1 J/cm³ degrees K.), and D is the thermal diffusivity in the solid averaged over the temperature profile (0.2 cm²/sec). Assuming $E_a$ is proportional to E, Equation (1) predicts the observed dependence of $\tau$ on E. Taking into account the reflectivity of the liquid surface at 1.06 μm, $E_a$ is 0.23 E. Using Equation (1), we then estimate the slope of the curves in FIG. 4 to be $3\times10^{-8}$ cm⁴sJ⁻². The measured slopes are $1.8\times10^{-8}$ cm⁴sJ⁻² for the $10^{16}$/cm² sample and $1.2\times10^{-8}$ cm⁴sJ⁻² for the $10^{15}/cm^2$ sample, in reasonable agreement with the estimate.

In addition to arsenic implanted silicon we have also observed similar reflectivity signatures in silicon (Si), GaAs (Te), GaP (Te and N), InP (Te), as well as crystalline silicon and germanium.

Although these experiments were done in bulk silicon and the amorphous layer was formed in the silicon by ion implantation mostly of significant impurities, the layer could also be formed by implantation of "inert" ions such as helium, or argon. Alternatively the layer could be evaporated or otherwise deposited onto a single crystal substrate either of the same material or a material with a matching lattice, thus forming a heterostructure such as Si on sapphire ($Al_2O_3$). In semiconductor processing it is typical to implant impurities into an epitaxially formed layer.

Figure 5:
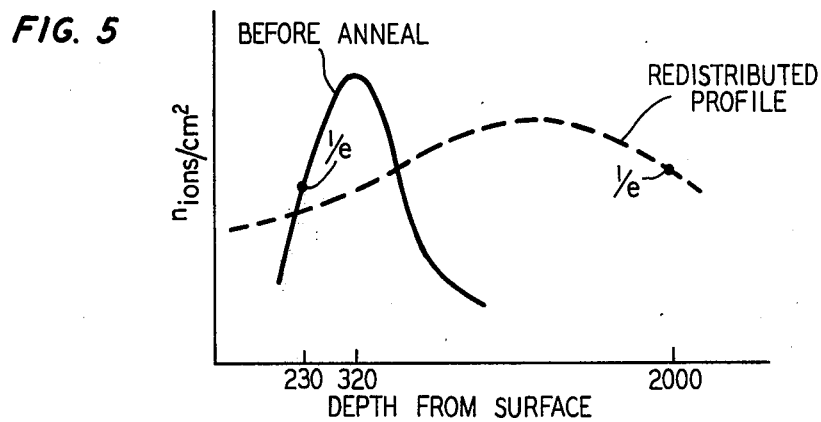
FIG. 5 is a plot showing the initial and final impurity distributions for an exemplary laser anneal.

The impurity profiles before and after the annealing process used in this demonstration are shown in FIG. 5. The impurities have been redistributed a considerable distance within the crystal.

In the embodiment described above the implanted region was effectively annealed to remove radiation damage at the same time redistribution of the impurities was effected. Alternatively the redistribution could be done as a separate step, or as an error correction or healing measure. Moreover, redistribution of impurities in metals, amorphous materials, or polycrystalline materials can be achieved with this process without the need for healing radiation damage.

The correlation between the depth to which the impurity region redistributes and the lifetime of the molten zone can be made empirically or can be calculated using liquid-phase diffusion constants. The former are possible using experiments such as that just described. The calculations can follow those just described although the liquid state diffusion constants are not as well established as those for the solid state.

Figure 6:
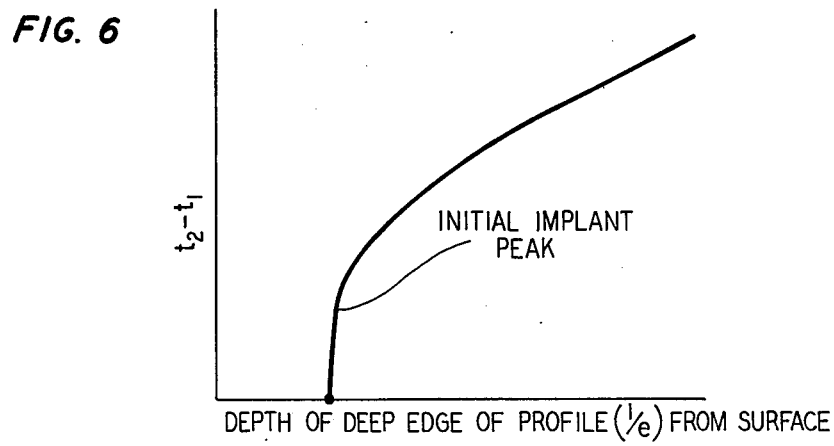
FIG. 6 is a plot of the final depth of an impurity layer as a function of the measured lifetime of the molten region.

A typical correlation curve based on the data described earlier is shown in FIG. 6. Enhanced depth redistribution occurs most effectively when the lifetime of the molten zone reflects penetration of the zone to below the initial location of impurities. The effect becomes gradual for a distance in which the depth of the molten layer approximates the impurity depth because the lifetime measurement shows only the state of the surface. The material where the impurities reside is liquid for a shorter period. The rate of solidification is believed to be a straightforward function so the error can be easily determined. When $t_2-t_1$ is large compared to the threshold time for melting and/or the impurities reside initially near the surface, redistribution will occur nearly proportionately.

If there is a need for the control to be automatic, a feedback arrangement similar to that suggested schematically in FIG. 2 can be used. For precise automatic control it may be desirable to use multiple laser pulses. This allows a convenient adjustment if the depth is to be varied from sample to sample. Alternatively the laser power can be adjusted. The timing circuit 24 simply integrates the time that the exposed region is molten and terminates the pulses when the prescribed period is complete. The detector 22 is designed in a straightforward manner to convey the timing signal to timing circuit 24 only when the surface of the exposed region is reflective.

The following examples illustrate some of the ways in which the exposure control of the invention can be implemented. All of them rely on the measurement of the integrated lifetime of the molten state at the surface of the sample being annealed.

EXAMPLE 1

In this example the threshold for melting of the surface is determined by exposing the surface to laser pulses of increasing energy until a change in surface reflectivity is measured, thus indicating the onset of melting. The details of the procedure are given above. The laser exposure is then continued at the threshold level or slightly above until the desired integrated exposure period is obtained. Depending on the laser pulse length a single pulse may be adequate, or many pulses may be used to give finer adjustment of the exposure time. This procedure is especially useful when the power window between inadequate power to effect annealing, and excessive power that causes catastrophic damage, is narrow. The size of the window, and the position in terms of power level, may vary significantly from sample to sample depending upon the depth and extent of damage, the surface characteristics, and the laser characteristics. It is largely this reason that makes it useful to monitor each sample, rather than exposing all samples with a similar processing history to a predetermined laser pulse.

EXAMPLE 2

In this example the duration of a single laser pulse, which may alternatively be considered as a continuous laser beam, is controlled in response to changes in the surface reflectivity. The important measurement in this case is the onset of melting, again assumed to be variable from sample to sample. The amount of power necessary to initiate melting is a complex measure of the power being absorbed by the sample which in turn is a function of several variables including the amount of damage, the concentration of impurities, the depth of both, and the surface characteristics of the sample. Therefore, a longer delay between the initial exposure to the laser and the onset of melting, suggests the need for longer exposure to achieve annealing. It is, then, useful to measure the onset of melting and control the termination of the laser energy in accordance with the delay between the energization of the laser and that measurement. At this point we only know how to create the program interrelating the delay and the necessary exposure time by empirical processes, as are straightforward in the art.

In Example 1 it was suggested that the use of many short pulses rather than one or a few pulses may give an added dimension to controlling the integrated exposure period. In principle it would seem that the pulse repetition rate would not matter since the procedure described here measures the integrated lifetime of the molten state at the surface of the sample and it would not matter whether the surface is continuously or intermittently molten. However, in practice we have found that the surface characteristics change after melting and refreezing so that the power required to initiate melting after refreezing may be different from that needed initially. In fact, if the damage anneals significantly during the first pulse, which is likely if melting occurs, then the sample may not absorb sufficiently to remelt. Therefore, we envision use of the procedure outlined in Example 2, or the use of pulses with repetition rates that may not allow the sample to solidify at the surface. Pulse repetition rates of the order of $10^6$ Hz will normally be adequate when processing conventional semiconductor materials. It may be useful to employ a series of pulses to obtain a long molten state lifetime when, for example, the objective is to redistribute impurities in addition to annealing damage.

EXAMPLE 3

This example relies on impurity redistribution during laser exposure. The sample initially is implanted with both boron, a p-type impurity, and arsenic, an n-type impurity. The substrate has at least a surface layer relatively lightly doped n-type. Exposure of this structure to laser energy by the techniques described previously to give a molten state with a lifetime of $10^{-6}$ sec moves the boron deeper into the lightly doped n-layer than the slower moving arsenic, thus creating an n-p-n transistor structure with a base width of approximately 0.5 micrometers, and an emitter depth of approximately 1 micrometer.

The detailed description of this invention is given in terms of annealing with laser radiation. Electron beam radiation is equivalent in nearly all respects to laser radiation for the purposes described. In this connection reference is made to U.S. Pat. No. 4,082,958 issued Apr. 4, 1978 to A. H. Kirkpatrick. Although this patent suggests avoiding melting the region to be annealed we have shown that melting can be a desirable objective. The power of the electron beam can be adjusted in a straightforward way in order to reach the melting region where the control principles of the invention will be useful.

Various other modifications of this invention will become apparent to those skilled in the art. All variations which rely on the teachings through which this invention has advanced the art are properly considered to be within the spirit and scope of this invention.

We claim:

1. A process for controllably converting nonsingle crystal material to single crystal material comprising the steps of:

creating an amorphous or polycrystalline material on a single crystal substrate, exposing at least the amorphous or polycrystalline layer to a laser or electron beam for a time period sufficient to melt the entire thickness of the layer and a portion of the substrate, and removing the beam after said time period so that the molten material regrows epitaxially on the unmelted portion of the substrate, the invention characterized in that the reflectivity of the surface exposed to the beam is monitored during exposure, and the said time period is controlled in response to changes in the reflectivity of the surface.

2. The method of claim 1 in which the beam is pulsed at different energy levels and the pulses are controlled in response to changes in the reflectivity of the surface.

3. The method of claim 1 in which the beam is pulsed at a constant power level and the number of pulses to which the layer is exposed is controlled in response to changes in the reflectivity of the surface.

4. The method of claim 1 in which the layer is exposed to a single beam pulse and the duration of the pulse is controlled in response to changes in the reflectivity of the surface.

5. The method of claim 1 in which the layer is a semiconductor.

6. The method of claim 5 in which the substrate is a semiconductor.

7. The method of claim 6 in which the semiconductor is silicon.

8. The method of claim 6 in which the layer contains significant impurities.

9. The method of claim 8 in which the significant impurities have a conductivity type different from the conductivity type of the layer and the substrate.

10. The method of claim 5 in which the substrate is $Al_2O_3$ and the layer is silicon.

11. The method of claim 1 in which the layer is essentially amorphous silicon.

12. The method of claim 1 in which the layer is amorphous and is created by implanting impurities into the substrate.

13. The method of claim 12 in which the impurities are of a conductivity type different from that of the substrate thus forming a p-n junction.

14. The method of claim 13 in which the p-n junction is relocated deeper within the substrate during the exposure.

15. The method of claim 14 in which the depth at which the p-n junction is relocated is controlled in response to changes in the reflectivity of the surface.

16. The method of claim 13 in which the beam exposure is controlled so that the p-n junction remains essentially in place during exposure.

* * * * *